United States Patent
Ranjan et al.

(10) Patent No.: US 8,906,760 B2
(45) Date of Patent: Dec. 9, 2014

(54) ASPECT RATIO DEPENDENT DEPOSITION TO IMPROVE GATE SPACER PROFILE, FIN-LOSS AND HARDMASK-LOSS FOR FINFET SCHEME

(71) Applicant: Tokyo Electron Limited, Tokyo (JP)

(72) Inventors: Alok Ranjan, Slingerlands, NY (US); Angelique Denise Raley, Halfmoon, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/803,473

(22) Filed: Mar. 14, 2013

(65) Prior Publication Data
US 2013/0260561 A1    Oct. 3, 2013

Related U.S. Application Data

(60) Provisional application No. 61/622,711, filed on Apr. 11, 2012, provisional application No. 61/613,985, filed on Mar. 22, 2012.

(51) Int. Cl.
| | |
|---|---|
| H01L 21/336 | (2006.01) |
| H01L 21/8234 | (2006.01) |
| H01L 21/02 | (2006.01) |
| H01L 21/311 | (2006.01) |

(52) U.S. Cl.
CPC .... *H01L 21/02112* (2013.01); *H01L 31/31116* (2013.01); *H01L 21/0212* (2013.01); *H01L 21/02126* (2013.01); *H01L 21/31144* (2013.01); *H01L 21/02271* (2013.01); *H01L 21/02274* (2013.01)

USPC .......... 438/197; 438/218; 438/219; 438/427

(58) Field of Classification Search
CPC . H01L 29/66045; H01L 29/78; H01L 27/088; H01L 29/66553; H01L 29/7831; H01L 29/772
See application file for complete search history.

(56) References Cited

U.S. PATENT DOCUMENTS

| | | |
|---|---|---|
| 3,700,510 A | 10/1972 | Keene |
| 4,418,095 A | 11/1983 | Young |
| 6,251,791 B1 | 6/2001 | Tsai |
| 7,052,997 B2 | 5/2006 | Sandhu |

(Continued)

FOREIGN PATENT DOCUMENTS

WO    2011108663    9/2011

OTHER PUBLICATIONS

International Search Report for PCT/US13/34418, United States Patent and Trademark Office, Jul. 1, 2013.

(Continued)

*Primary Examiner* — Duy Deo

(57) ABSTRACT

Techniques disclosed herein include systems and methods for an aspect ratio dependent deposition process that improves gate spacer profile, reduces fin loss, and also reduces hardmask loss in a FinFET or other transistor scheme. Techniques include depositing an aspect ratio dependent protective layer to help tune profile of a structure during fabrication. Plasma and process gas parameters are tuned such that more polymer can collect on surfaces of a structure that are visible to the plasma. For example, upper portions of structures can collect more polymer as compared to lower portions of structures. The variable thickness of the protection layer enables selective portions of spacer material to be removed while other portions are protected.

20 Claims, 14 Drawing Sheets

(56) References Cited

U.S. PATENT DOCUMENTS

| | | |
|---|---|---|
| 7,115,947 B2 | 10/2006 | Clark |
| 7,393,768 B2 | 7/2008 | Degroote |
| 7,399,664 B1 | 7/2008 | Anderson |
| 7,473,593 B2 | 1/2009 | Anderson |
| 7,579,252 B2 | 8/2009 | Goulakov |
| 7,646,070 B2 * | 1/2010 | Anderson et al. ............. 257/401 |
| 7,719,043 B2 | 5/2010 | Yamagami |
| 8,133,797 B2 | 3/2012 | Van Schravendijk |
| 8,586,487 B2 * | 11/2013 | Nguyen et al. ................ 438/791 |
| 2006/0022268 A1 * | 2/2006 | Oh et al. ........................ 257/347 |
| 2006/0154423 A1 | 7/2006 | Fried |
| 2011/0193172 A1 | 8/2011 | Juengling |
| 2011/0201164 A1 * | 8/2011 | Chung et al. .................. 438/229 |
| 2013/0115777 A1 * | 5/2013 | Tung et al. .................... 438/703 |

OTHER PUBLICATIONS

Martin Kogelschatz, Gilles Cunge, and Nader Sadeghi, "Analysis of the chemical composition and deposition mechanism of the SiOx-Cly layer on the plasma chamber walls during silicon gate etching", J. Vac. Sci. Technol. A 22, 624 (2004) (Abstract only).

* cited by examiner

ASPECT RATIO DEPENDENT DEPOSITION TO IMPROVE GATE SPACER PROFILE, FIN-LOSS AND HARDMASK-LOSS FOR FINFET SCHEME

CROSS-REFERENCE TO RELATED APPLICATIONS

Pursuant to 37 CFR §1.78(a)(4), this application claims the benefit of and priority to U.S. Provisional Application Ser. No. 61/622,711, filed on Apr. 11, 2012, the entire content of which is herein incorporated by reference. This application also claims the benefit of and priority to U.S. Provisional Application Ser. No. 61/613,985, filed on Mar. 22, 2012, the entire content of which is herein incorporated by reference.

FIELD OF INVENTION

This disclosure relates to fabrication of features in a semiconductor device, including fabrication via etching and deposition processes.

BACKGROUND OF THE INVENTION

Fabrication of semiconductor devices is a multi-step process of forming features on a semiconductor substrate or other substrate. Steps can include material growth, patterning, doping, deposition, etching, metallization, planarization, and so forth. Features formed on a substrate can include various transistors. Transistors can be planar or non-planar, and can also have single gates or multiple gates. Non-planar transistors (sometimes referred to as 3D transistors) include the FinFET (fin field effect transistor), among others. Such non-planar transistors typically include a vertically-oriented or raised fin that functions as a channel between the source and drain. The gate is also vertically-oriented or raised and is positioned over the fin (on top of the fin and around fin sidewalls). Such non-planar transistors can have multiple fins and/or multiple gates. Planar transistors also have associated heights, but relative heights of non-planar features are usually greater than those of planar transistors.

Fabrication of semiconductor devices often includes deposition of spacer and/or dummy materials to assist in constructing a given feature design, including features on non-planar transistors. Sidewall spacers are often specified on non-planar transistors for improved gate functionality. As the dimensions of the transistor gate continue to shrink, the fringe capacitance between the gate and contact, as well as between the gate and facet of the source/drain (S/D), has increased. To counter this increase in fringe capacitance, low-k dielectric materials have been implemented as the spacer material. The success of a spacer is affected by a spacer etch process, which can affect both the dielectric constant of the spacer, as well as spacer coverage.

SUMMARY OF THE INVENTION

During the fabrication of a transistor gate, a spacer material is conformally applied to the transistor gate and other structures, and then partially removed to form a sidewall spacer on a sidewall of the transistor gate. This partial removal specifies removing spacer material from the other structures, while leaving spacer material on the gate or on gate sidewalls. Such partial removal is typically executed using one or more etching processes, but can be challenging because of the differing heights of features being etched simultaneously. Having features of different heights means that some spacer material is some locations will be etched through to underlying material faster than spacer material at other locations.

Fabrication of some transistor devices specifies that a spacer material is conformally applied to the transistor gate and fins, and then completely removed from around the fins while leaving sidewall spacer material on the transistor gate. FinFET gate spacer fabrication can require long anisotropic over-etch process times to completely remove spacer material (such as silicon nitride) from around fins. This relatively long over-etch period, however, can cause critical dimension loss, spacer pull down, fin-loss, and even hardmask (on gate) loss. If an etching process is not anisotropic, then radicals will attack gate spacers causing loss of critical dimensions of the spacer. Thus, one challenge is to remove a conformal layer from fins while leaving conformal material on sidewalls of an adjacent gate. More broadly, challenges involve removing spacer materials from features of differing heights—or from features of differing aspect ratios—without damaging underlying materials and profile.

Techniques disclosed herein include systems and methods for an aspect ratio dependent deposition process that improves gate spacer profile, reduces fin loss, and also reduces hardmask loss in a FinFET scheme. Techniques include depositing an aspect ratio dependent protective layer to help tune profile of a structure during fabrication.

One embodiment includes an aspect ratio dependent deposition to tune a FINFET spacer profile. For example, before a given spacer etch step, a thin layer of polymer is deposited on a given structure as a protection layer. The thickness of the deposited protection layer (thin layer of polymer) is aspect ratio dependent. This means that more polymer can be deposited at the top of a structure as compared to an amount of polymer deposited on a bottom of the structure or on structure surfaces that have a lesser height.

After the deposition (depo) step, a breakthrough step may be used to remove some of the polymer to enable etching of the conformal layer between the fins of a finFET device (when there are multiple fins). After the breakthrough step, a spacer etch step may be performed. Spacer etch chemistry can include $C_xH_yF_z$-based chemistry with addition of argon, oxygen, and/or nitrogen. Spacer etch chemistry can be chosen to have high SiN selectivity over fin material. In other embodiments, the steps of deposition, breakthrough (anisotropic removal), and spacer etch can be a cyclical process.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION OF SEVERAL EMBODIMENTS

Techniques disclosed herein includes systems and methods for an aspect ratio dependent deposition process that improves gate spacer profile, reduces fin loss, and also reduces hardmask loss in a FinFET scheme. In general, techniques include depositing an aspect ratio dependent protective layer to help tune a profile of a structure during fabrication. The protective layer can be deposited such that the protective layer has a greater thickness on surfaces that are taller compared to adjacent surfaces. This additional thickness can help protect certain features from long over-etch times.

Figure 1:
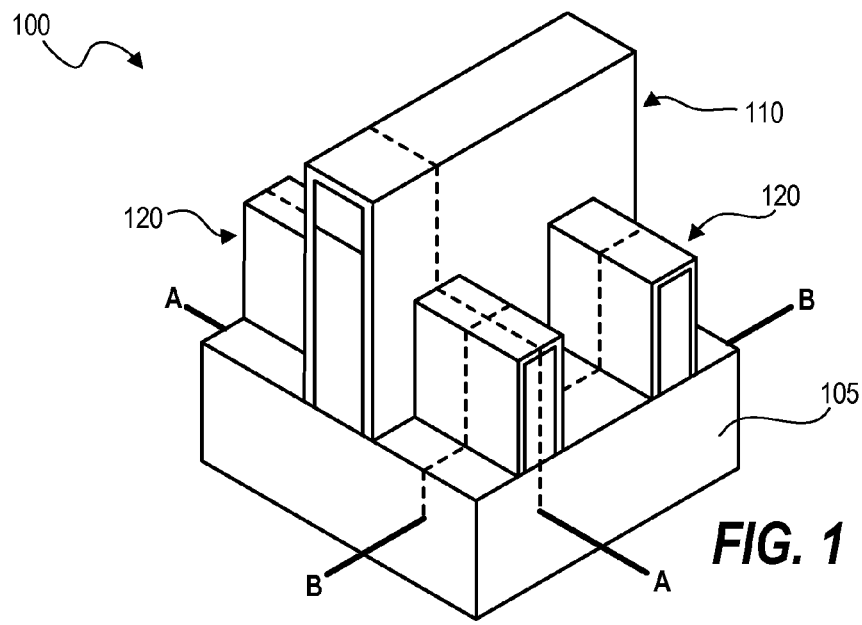
FIG. 1 is perspective view of a conventional non-planar transistor device.

FIG. 1 is a perspective view of a segment of a conventional FinFET (Fin Field Effect Transistor) device 100. This particular FinFET device shows a gate 110 and fins 120 on underlying substrate 105. Section line A shows a cross-sectional cut of a gate of the device along a longitudinal length of a fin. Section line B shows a cross-sectional cut across two fins of the device.

Figures 2A, 2B:
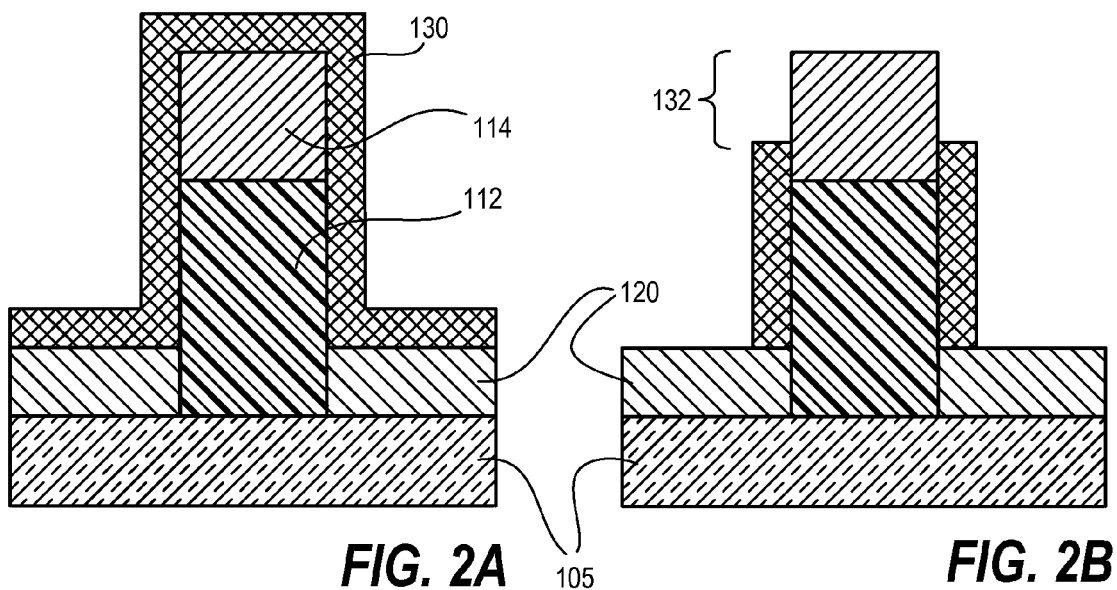
FIGS. 2A-2B and 3A-3B are a schematic representation of spacer pull-down during a partial etch process.

As noted above in semiconductor manufacturing, when fabricating a transistor gate, a spacer material is conformally applied to the transistor gate, and then partially removed to form a sidewall spacer on a sidewall of the transistor gate. FIGS. 2A-2B and FIGS. 3A-3B illustrate a problem with conventional techniques for creating spacers. FIG. 2A is a cross-sectional view of a gate structure of a transistor being fabricated. Substrate 105 can be a wafer, or one or more layers resting on the wafer, or another substrate.

Figures 3A, 3B:
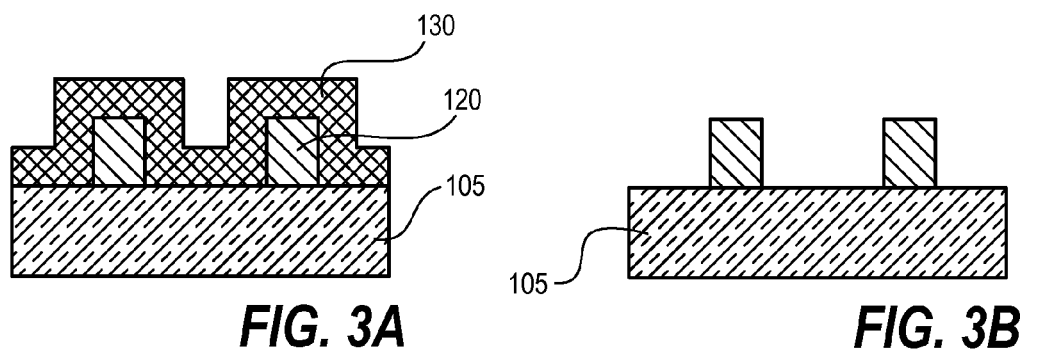

Gate 112 can be embodied either an actual gate structure or embodied as a dummy gate. During fabrication of semiconductor devices, various materials can be applied and subsequently removed or replaced according to a given fabrication scheme. For example, place holder materials or dummy gates can be used for spacer deposition. On top of dummy gate 112 is hardmask 114. Fin 120 is shown extending from the dummy gate along substrate 105. FIG. 3A is a cross-sectional view of fin structures of a transistor being fabricated.

A conformal layer 130 is then deposited over the dummy gate 112, hardmask 114, and fins 120. The conformal layer 130 can be applied via a vapor deposition process to conform to the topography of the gate structure. For example, the conformal layer 150 (spacer material) may be deposited using a chemical vapor deposition (CVD) process, a plasma-enhanced CVD (PECVD) process, filament-assisted CVD (FACVD), an atomic layer deposition (ALD) process, a plasma-enhanced ALD (PEALD) process, a physical vapor deposition (PVD) process, a sputtering process, etc. The initial conformal layer critical dimension (CD) may range from about 2 nm (nanometers) to about 20 nm, or preferably from about 5 nm to about 15 nm, or more preferably from about 8 nm to about 12 nm (e.g., about 9-10 nm). This conformal layer is then etched to become a spacer material around the dummy gate 112 and hardmask 114. This spacer material, however, needs to be completely removed around the fins via an etch process. FIG. 3B shows fins 120 with all spacer material (conformal layer) removed. To remove the conformal layer 130 from the fins requires relatively long etch times. By way of a non-limiting example, some heights of fins are around 30 nm and the conformal layer can be around 12 nm. This means to remove all conformal layer material from around the fins, the etch process needs to etch away about 42 nm of material. This leads to an undesirable spacer pull down 132 around the hardmask 114 as shown in FIG. 2B. The hardmask 114 is often of the same material as the conformal layer, and so the hardmask can also be pulled down to the spacer level.

The spacer pull-down and hardmask loss can expose the dummy gate 112. When the dummy gate 112 is exposed then the transistor device will not work. There are also dangers to the fins from long etch times. Etch selectivity can be relatively poor, which can lead to almost 50% over etch times to remove all desired conformal layer material from the fins. This over etch period—after fins are exposed—can erode the fins themselves leading to poor device performance or device failure.

Techniques disclosed herein address these problems with an aspect ratio dependent deposition process. This deposition process essentially deposits more protective material on surfaces farther from the substrate. With such a protection layer of variable thickness, gate spacers can be protected while completely removing spacer material from around fins.

Aspect ratio refers to a structure's height relative to its width. Structures on the substrate can be characterized by an aspect ratio. Defined spaces, such as trenches, holes, vias, etc., can also be defined by an aspect ratio. As can be seen in FIG. 1, the gate 110 has a greater aspect ratio as compared to fins 120. Accordingly, more protective material can be deposited on the gate 110 as compared to the fin 120. This aspect ratio dependency can also be relative to a single structure. For example, the protective layer material can be deposited on a side wall of a structure, with more material being deposited towards the top of the structure, and less material being deposited towards the bottom of the structure.

Figure 4A:
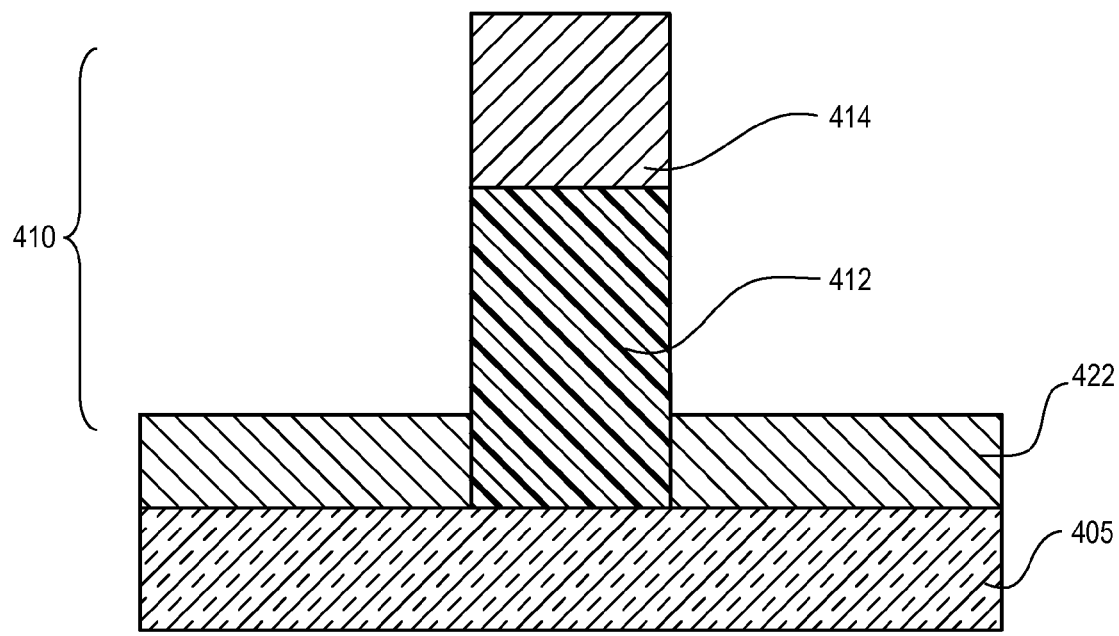
FIGS. 4A-4F illustrate a schematic representation of the preparation of a sidewall spacer for a gate structure on a substrate according to embodiments herein.
Figure 5A:
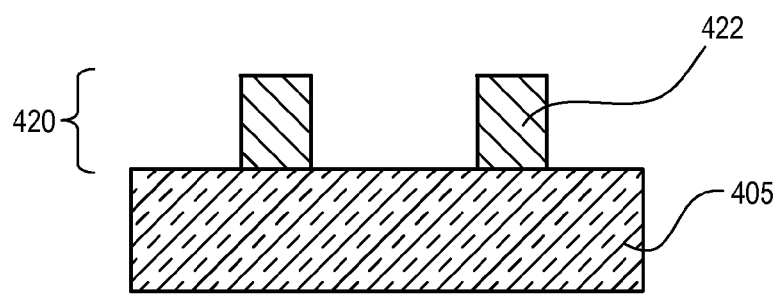
FIGS. 5A-5F illustrate a schematic representation of the preparation of a sidewall spacer for a gate structure on a substrate according to embodiments herein.

FIGS. 4A-4F and FIGS. 5A-5F are cross-sectional representations of a semiconductor device during a portion of device fabrication for preparing a spacer on a substrate structure. FIG. 4 shows a gate view of the first structure, and FIG. 5 shows a fin view of the second structure. FIG. 4A shows a first structure 410 on a substrate 405. This first structure can be, for example, a combination of dummy gate 412 and hardmask 414. Note that the first structure 410 can be constructed of a single material or of multiple materials. This first structure is characterized by a first aspect ratio or characterized by a first height with a first top portion extending a first height from the substrate. For example, the first structure can include a gate structure characterized by a gate critical dimension.

Adjacent to, or connected to, the first structure is a second structure 420 on the substrate 405. The second structure can include fin 422. Second structure 420 can be characterized by a second aspect ratio, or characterized by a second height with a second top portion extending a second height from the substrate. For example, the second structure can include a fin structure arranged orthogonal to the gate structure, the gate structure being conformally applied over the fin structure. The first height can extend farther from the substrate as compared to the second height, or the first aspect ratio can be greater than the second aspect ratio. For example, the fin structure can include a plurality of fins, with each fin being characterized by a fin critical dimension.

The substrate 405 may include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC (International Union of Pure and Applied Chemistry) notation in the Periodic Table of Elements; according to the revised or new IUPAC notation, these Groups would refer to Groups 2, 13, 15, 16, respectively). The substrate can be of any size, for example, a 200 mm (millimeter) substrate, a 300 mm substrate, a 450 mm substrate, or an even larger substrate.

Figure 4B:
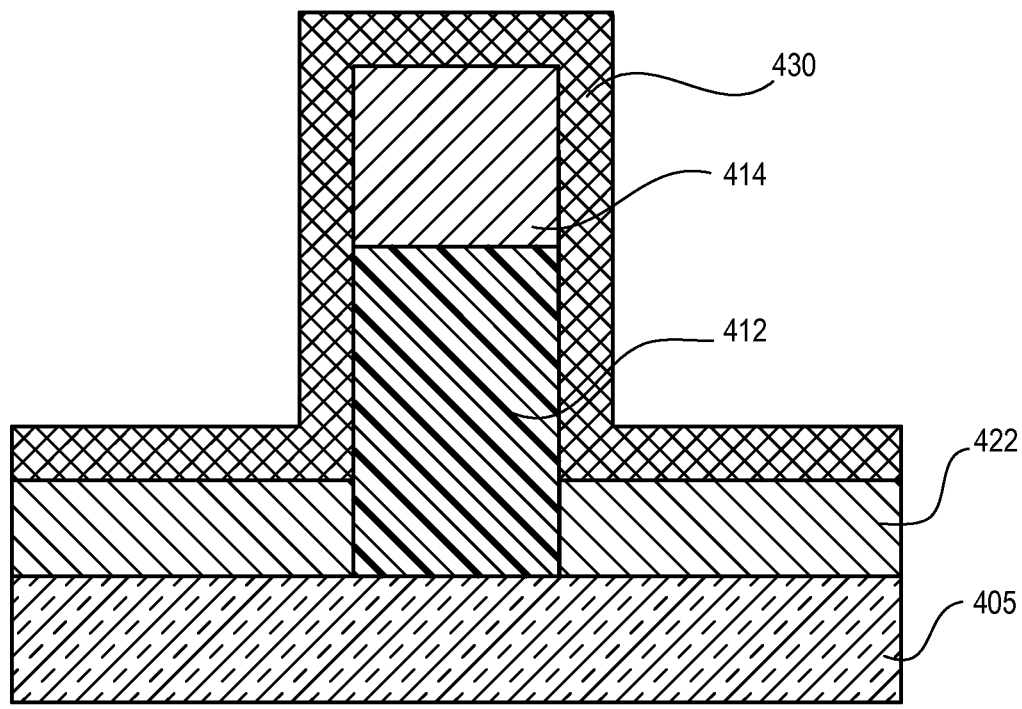
Figure 5B:
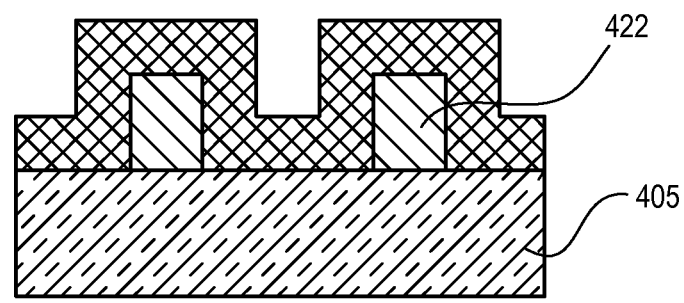

In FIGS. 4B and 5B, a conformal layer 430 is deposited over the first structure and over the second structure. As a conformal layer, a thickness of the layer is approximately uniform on both horizontal and vertical surfaces. This layer can be selected from various materials. By way of a non-limiting example, this conformal layer can be a layer composed of silicon nitride (SiN) silicon carbide (SiC), silicon carbonitride (SiCN), silicon oxycarbonnitride (SiOCN), boron-doped silicon nitride, carbon-doped silicon nitride, oxygen-doped silicon nitride, or carbon and boron-doped silicon nitride.

With particular applications, the conformal spacer material layer can have a thickness less than or equal to about 10 nanometers (nm).

Figure 4C:
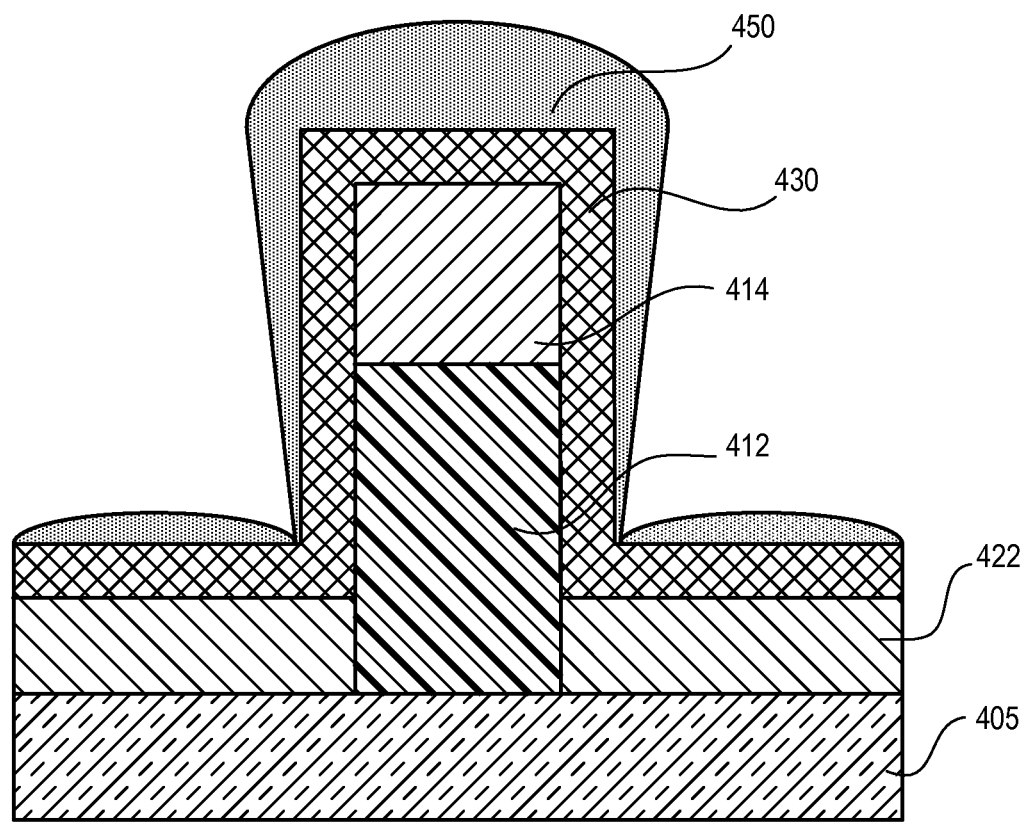
Figure 5C:
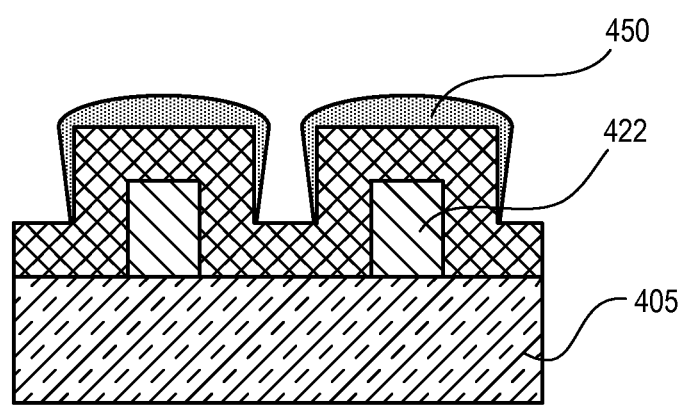
Figure 5D:
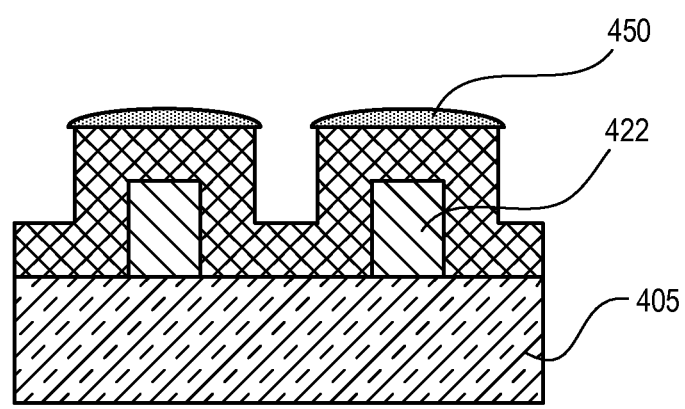

FIGS. 4C and 5C, show a result of an aspect ratio dependent deposition process that is performed. A protection layer 450 is deposited on the conformal spacer material layer 430. The aspect ratio deposition process is tailored to provide a first set of protection layer properties on the first structure different than a second set of protection layer properties on the second structure. Such protection layer properties can include hardness, thickness, composition, etc.

This deposition process can include creating a monomer material via a plasma formed above the substrate. The monomer material flows substantially isotropically towards the substrate. The monomer material has a sticking coefficient sufficient such that a first thickness of polymer protection layer is formed on the top portion of the first structure from monomers collected thereon and polymerization of the monomers. This first thickness is thicker than a second thickness of polymer protection layer formed on the top portion of the second structure.

The top areas (gate structures) of the device are more visible to a plasma formed above the substrate. As such, this top area can receive more deposition as compared to an amount of deposition received at the fins. With monomers or other species from the plasma traveling in random directions towards the substrate, top portions of structures are more open to receiving monomers. In contrast, if monomers were traveling anisotropically towards the substrate then horizontal surfaces of the substrate structures would receive approximately equal amounts of the monomer while vertical surfaces would receive small amounts of monomer.

With certain process conditions and chemistry, monomers within the plasma can have a relatively high degree of stickiness such that a given monomer typically sticks or adheres to a first surface encountered and forms a polymer with neighboring monomers. Upper surfaces are typically encountered first by monomers traveling in random directions toward the substrate. Accordingly, more polymer collects at the top of structures, and thins as surfaces of the structure approach the substrate because the supply of monomers lessens. In other words, polymer collection on surfaces of device structures is dependent on visibility to the plasma or "seeing" the plasma. Accordingly, surfaces that are shadowed get proportionally less exposure as the monomer/polymer descends isotropically, while surfaces that are higher or closer to the plasma collect more polymers. The result is a relatively small amount of polymer (protection layer) on lower surfaces, while there is comparatively more polymer on the taller/tallest surfaces—that is, farthest from the substrate or closest to the plasma source.

Note that this aspect ratio dependent deposition is generally isotropic deposition. In alternative embodiments, however, a bias power can be supplied such the monomer/polymer ion species can be deposited anisotropically. The bias power can be tuned to balance an amount of anisotropic deposition compared to isotropic deposition. Such bias power tuning can be used to balance deposition amounts between upper and lower surfaces, and also between horizontal and vertical surfaces. With more anisotropic deposition, horizontal surfaces—both upper and lower—will receive approximately equal amounts of polymer, while vertical surfaces receive relatively little deposition. With more isotropic deposition, upper horizontal surfaces and upper vertical surfaces will receive more polymer as compared to lower vertical and lower horizontal surfaces.

By way of a non-limiting example, depositing the protection layer 450 on the conformal layer 430 can include depositing a SiOCl-containing layer. The SiOCl-containing layer contains Si, O, and Cl. The protection layer 450 can be formed by performing a vapor deposition process in an environment containing Si, Cl, and O. In one embodiment, the protection layer 450 is formed by performing a plasma-assisted deposition process that includes generating plasma using a film forming process composition containing as incipient ingredients $SiCl_4$ and $O_2$. While the film forming process composition includes $SiCl_4$ and $O_2$, other Cl-containing and O-containing gases or vapors can be substituted or added. For example, the protection layer process composition may include, as incipient ingredients, silane ($SiH_4$), a Cl-containing gas (e.g., $Cl_2$, HCl, etc.), and an oxygen-containing gas (e.g., $O_2$). To form the plasma in the plasma-assisted deposition process, constituents of the film forming process composition should be selected that exist in a gaseous and/or vapor phase either alone or in combination with a carrier gas (e.g., a noble gas element or nitrogen) at atmospheric and/or vacuum pressures.

Alternatively, the protection layer 450 may contain C and at least one element selected from the group consisting of F and H. The protection layer 450 may be formed by performing a vapor deposition process in an environment containing C and at least one element selected from the group consisting of F and H. In one embodiment, the protection layer 450 is formed by performing a plasma-assisted deposition process that includes generating plasma using a film forming process composition containing as incipient ingredients a fluorocarbon gas expressed as $C_xH_yF_z$, where x and z are non-zero. For example, the fluorocarbon gas may include $CF_4$, $C_4F_6$, $C_4F_8$, $C_5F_8$, $CH_3F$, $CHF_3$, $CH_2F_2$, etc. For example, the film forming process composition may include as incipient ingredients $C_4F_8$ and Ar.

In another embodiment, the protection layer 450 is formed by performing a plasma-assisted deposition process that includes generating plasma using a film forming process composition containing as incipient ingredients a hydrocarbon gas expressed as $C_xH_y$, where x and y are non-zero. For example, the hydrocarbon gas may include $CH_4$, $C_2H_2$, $C_2H_4$, $C_2H_6$, $C_3H_8$, etc. To form the plasma in the plasma-assisted deposition process, constituents of the film forming process composition should be selected that exist in a gaseous and/or vapor phase either alone or in combination with a carrier gas (e.g., a noble gas element or nitrogen) at atmospheric and/or vacuum pressures.

Figure 4D:
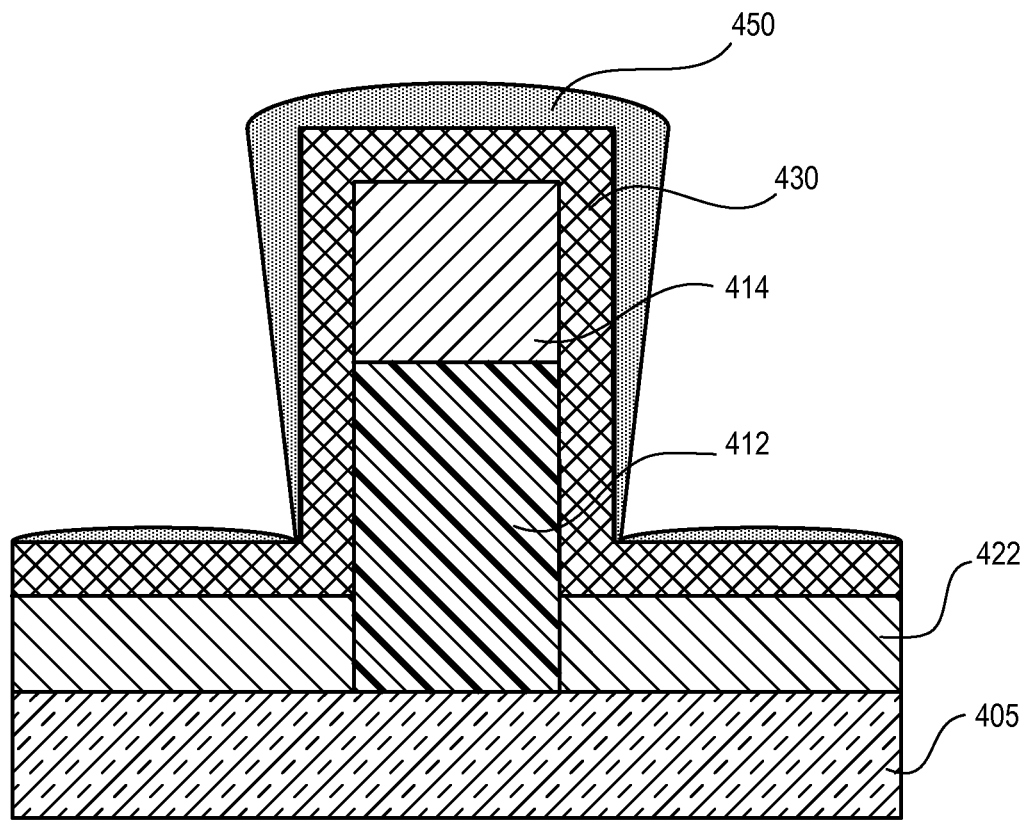
Figure 4E:
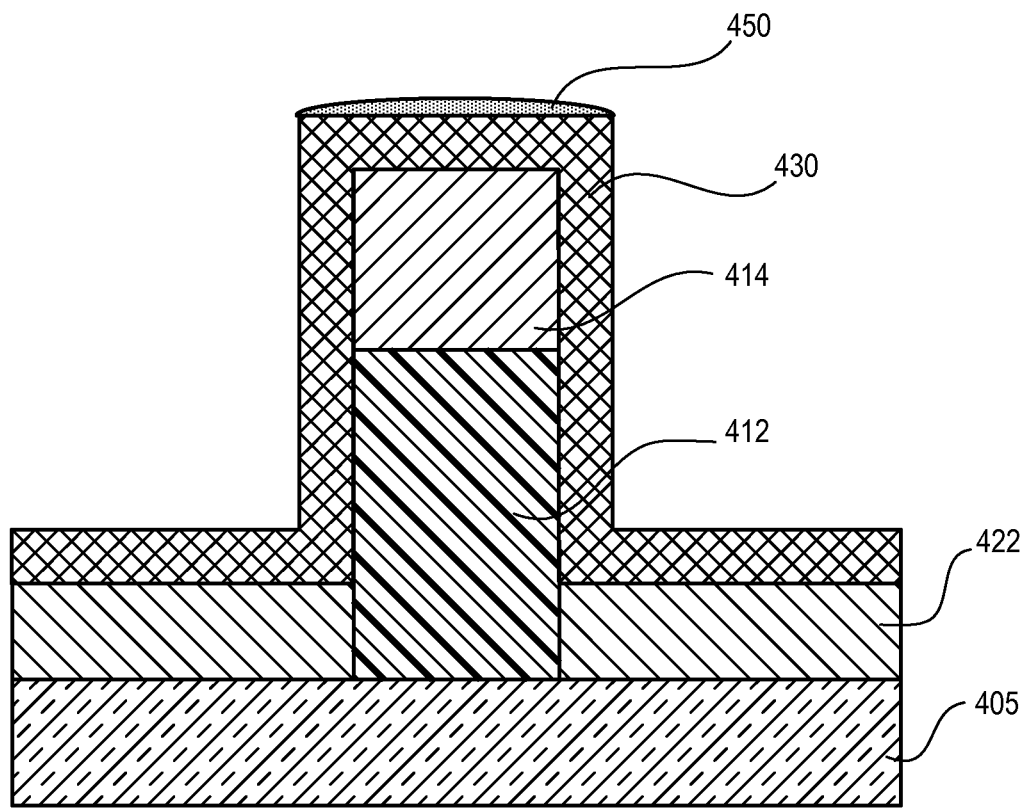
Figure 5E:
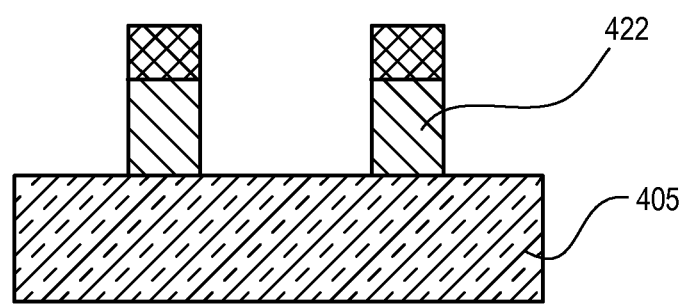

After deposition of the polymer, spaces between fins can be partially covered, such as the polymer caps between fins in FIG. 5C. A breakthrough etch step can then be executed. FIGS. 4E and 5E show a result of a breakthrough etch step. An example breakthrough etch can be an anisotropic etch using Argon. Deposited polymer material is thinner between fins as compared to on top of fins, so polymer material between fins (overhanging a fin) can be removed while keeping polymer material on top of fins.

Figure 4F:
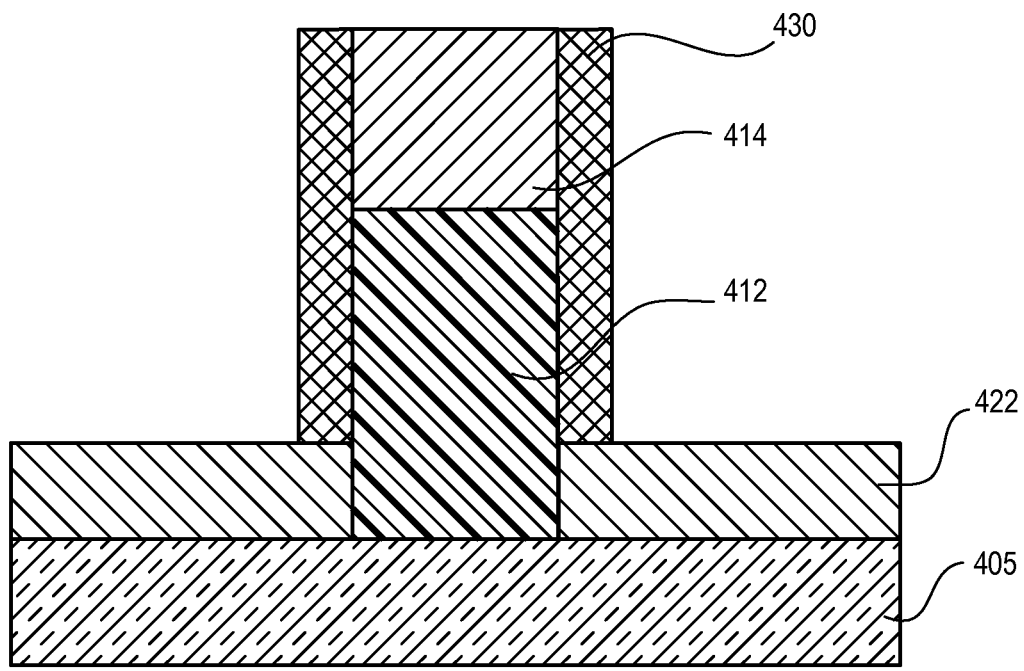
Figure 5F:
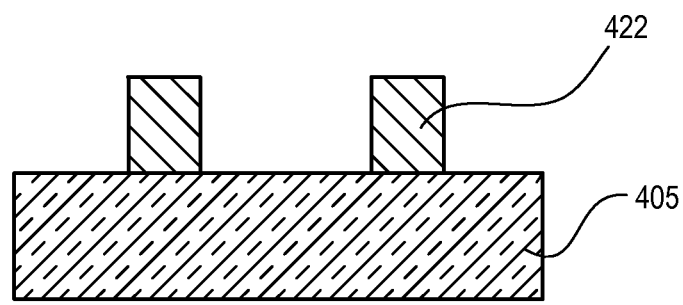
Figure 7A:
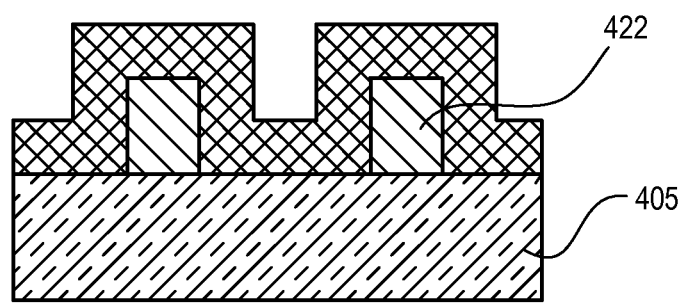
FIGS. 7A-7E illustrate a schematic representation of the preparation of a sidewall spacer for a gate structure on a substrate according to embodiments herein.
Figure 7B:
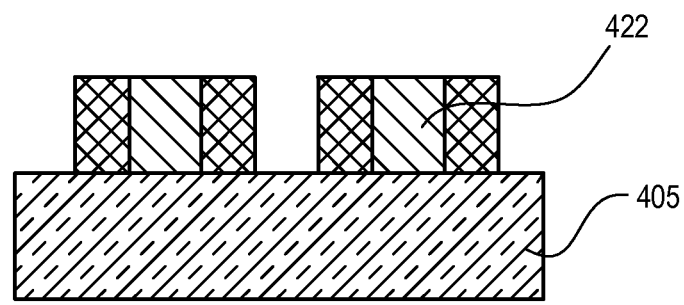
Figure 7C:
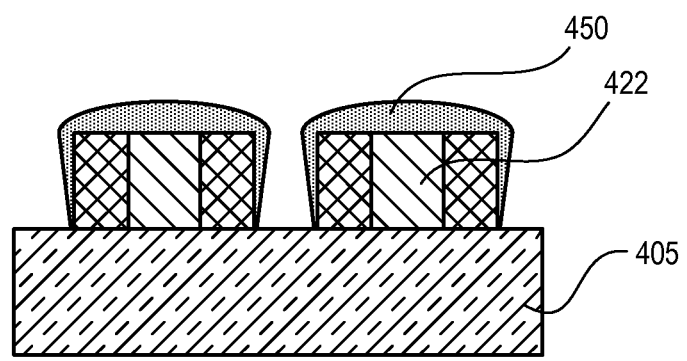

In FIGS. 4E and 5E, after the breakthrough etch, a spacer etch process can be performed that removes the conformal spacer material layer from the second structure, while retaining the conformal spacer material layer on at least part of the first structure. For example, a main etch step can be executed that selectively and anisotropically removes conformal layer material from around the fins. This main etch can also reduce polymer thickness. The main etch can be followed by an over etch step and/or subsequent removal of the protection layer. FIGS. 4F and 5F show resultant cross sections. Note that all conformal layer material has been removed from around fins (except where fins contact the dummy gate) with minimal fin loss. Also note that the conformal layer material on the side of the dummy gate as well as the hardmask on top of the dummy gate remains largely intact with minimal spacer pull down or hardmask loss. Thus, this aspect ratio dependent deposition process and subsequent etching provides a spacer on the first structure while removing the spacer from the second structure.

The one or more etching processes may include a plasma etching process that involves forming plasma from an etching process composition and exposing the substrate 405 to the plasma. The etching process composition may contain a halomethane gas. The halomethane gas may include a mono-substituted halomethane (e.g., $CH_3F$), a di-substituted halomethane (e.g., $CH_2F_2$), a tri-substituted halomethane (e.g., $CHF_3$), or a tetra-substituted halomethane (e.g., $CF_4$).

Additionally, for example, the etching process composition may contain a hydrocarbon (i.e., $C_xH_y$, where x and y are equal to unity or greater). Alternatively, for example, the etching process composition may contain a fluorocarbon (i.e., $C_xF_y$, where x and y are equal to unity or greater). Alternatively yet, for example, the etching process composition may contain a gas having the chemical formula $C_xH_yR_z$, where R is a halogen element, x and y are equal to unity or greater, and z is equal to zero or greater.

The etching process composition may contain a fluorine-containing gas, a chlorine-containing gas, a bromine-containing gas, or a halide gas. For example, the etching process composition may contain HBr, $F_2$, $Cl_2$, $Br_2$, $BCl_3$, $NF_3$, or $SF_6$.

The etching process composition may contain a noble gas. The etching process composition may contain an oxygen-containing gas, a hydrogen-containing gas, a nitrogen-containing gas, or a carbon-containing gas, or any combination of two or more thereof. For example, the etching process composition may contain $H_2$, $O_2$, $N_2$, CO, $CO_2$, $NH_3$, NO, $N_2O$, or $NO_2$, or any combination of two or more thereof.

To form the plasma in the plasma etching process, constituents of the etching process composition should be selected that exist in a gaseous and/or vapor phase either alone or in combination with a carrier gas (e.g., a noble gas element or nitrogen) at atmospheric and/or vacuum pressures.

In one embodiment, the etching process composition may contain $CH_3F$ and Ar. In another embodiment, the etching process composition may contain $CH_3F$, $O_2$, and Ar. In yet another embodiment, the etching process composition may contain $CF_4$ and Ar.

The one or more etching processes may include preparation of an etch process recipe. The etch process recipe may include one or more process conditions defined by one or more process parameters. The one or more process conditions may be established by setting one or more process parameters, such as: setting a flow rate of the process composition; setting a pressure in the plasma processing system; setting a first radio frequency (RF) power level for a first RF signal applied to a lower electrode within a substrate holder for supporting and electrically biasing the substrate; setting a second RF (or microwave) power level for a second RF signal applied to a source antenna or electrode opposing the lower electrode above the substrate; setting a temperature condition for the plasma processing system; setting a temperature condition for the substrate or substrate holder; setting an etch time; and/or setting an over-etch time. During the etching process, any one of the process parameters may be varied.

In one embodiment, a plasma etching process may comprise a process parameter space that includes: a chamber pressure ranging up to about 1000 mtorr (millitorr) (e.g., up to about 200 mtorr, or ranging from about 3 to about 100 mtorr), a process gas flow rate ranging up to about 2000 sccm (standard cubic centimeters per minute) (e.g., up to about 1000 sccm, or about 1 sccm to about 200 sccm), an optional additive gas flow rate ranging up to about 2000 sccm (e.g., up to about 1000 sccm, or up to about 100 sccm, or up to about 10 sccm), an optional noble gas (e.g., He or Ar) flow rate ranging up to about 2000 sccm (e.g., up to about 2000 sccm, or up to about 1000 sccm), a plasma source power ranging up to about 3000 W (watts) (e.g., up to about 2500 W, or ranging from about 1500 W to about 2500 W), and a lower electrode (e.g., element 522 in FIGS. 5-11) RF power level for electrically biasing the substrate ranging up to about 1000 W (e.g., up to about 500 W, or up to about 300 W, or up to 250 W). Also, the plasma source can operate at an RF or microwave frequency, e.g., 10 MHz to 5 GHz. In addition, the lower electrode bias frequency can range from about 0.1 MHz to about 200 MHz, e.g., about 2 MHz or 13.56 MHz.

Following the performing of the one or more etching processes, any residual portions of the protection layer may be selectively removed from the sidewall spacer. In one embodiment, the selective removal of the residual portion of the protection layer 450 is achieved by performing a wet cleaning process. For example, the wet cleaning process may include immersing the residual portion the protection layer in an HF solution, such as a dilute aqueous HF solution.

The schematic drawings in FIGS. 6 and 7 show progression of an alternative aspect ratio deposition process. FIG. 6 shows a gate view of the first structure (such as a dummy gate and hard mask), and FIG. 5 shows a fin view of the second structure (such as fins). This starting structure is similar to the starting structure in FIGS. 4A and 5A. In FIGS. 6B and 7B, a conformal layer 430 is deposited over the first structure and over the second structure. After the conformal layer is deposited, a preliminary etch process removes the conformal layer from the top of the first structure and from the top of the second structure, as shown in FIGS. 6C and 7C. For example, an anisotropic etch is performed to expose a top surface of the fins 422 and the hardmask 414.

Figure 6A:
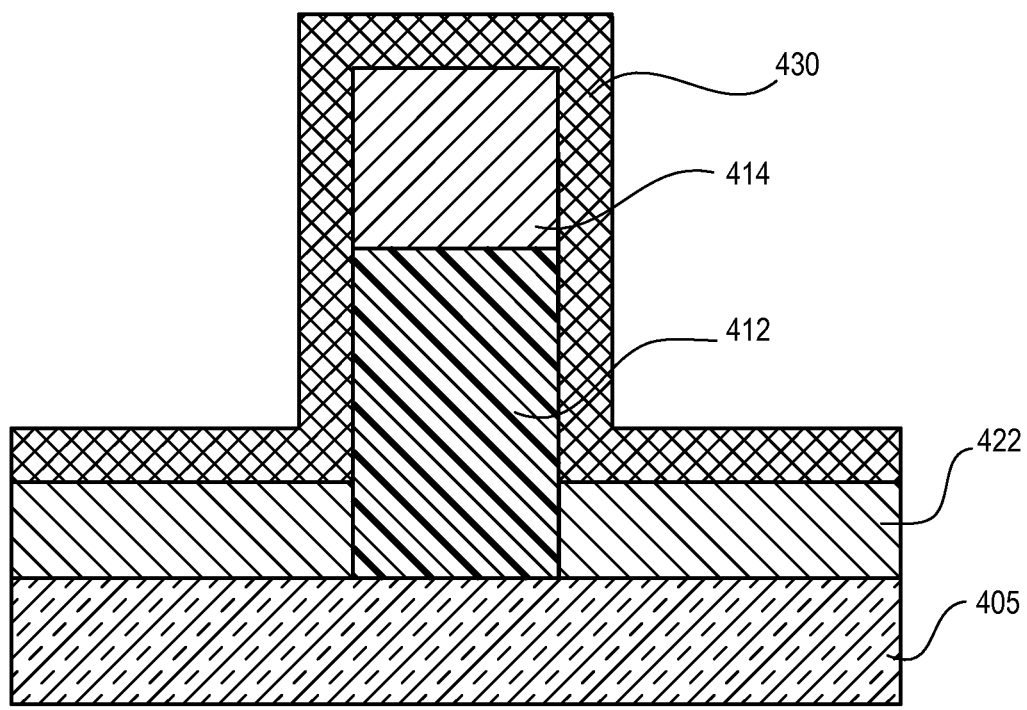
FIGS. 6A-6E illustrate a schematic representation of the preparation of a sidewall spacer for a gate structure on a substrate according to embodiments herein.
Figure 6B:
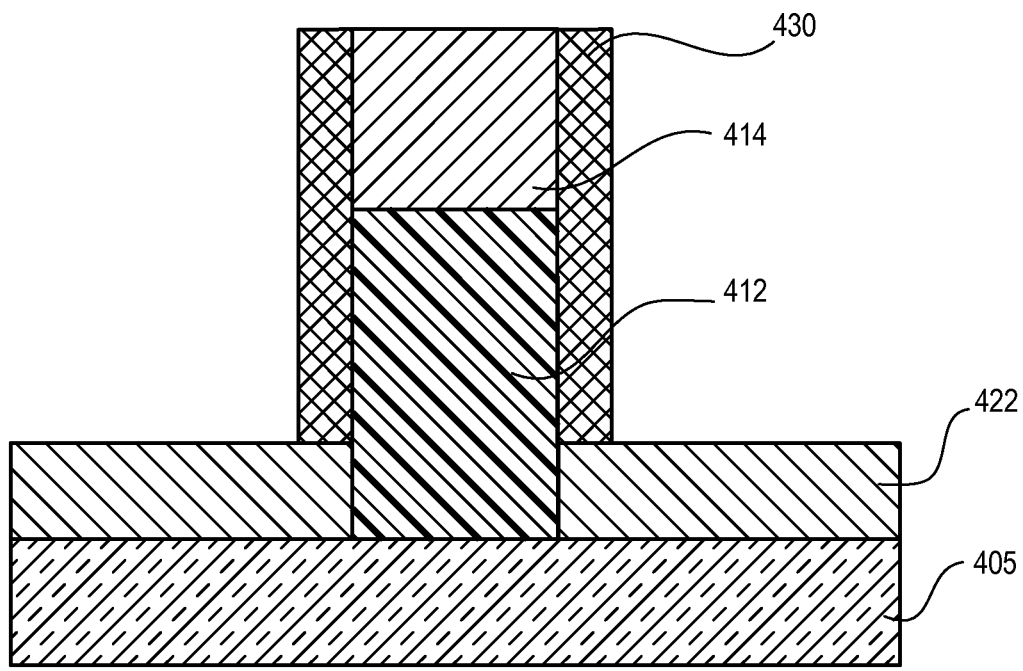
Figure 6C:
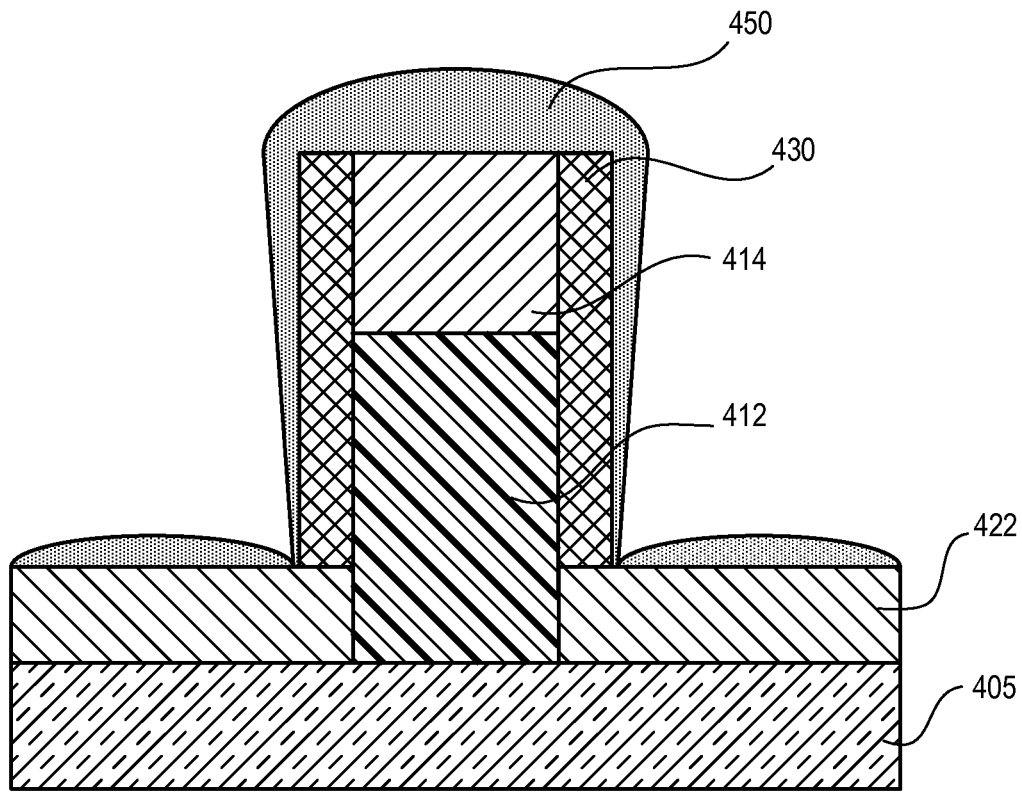
Figure 6D:
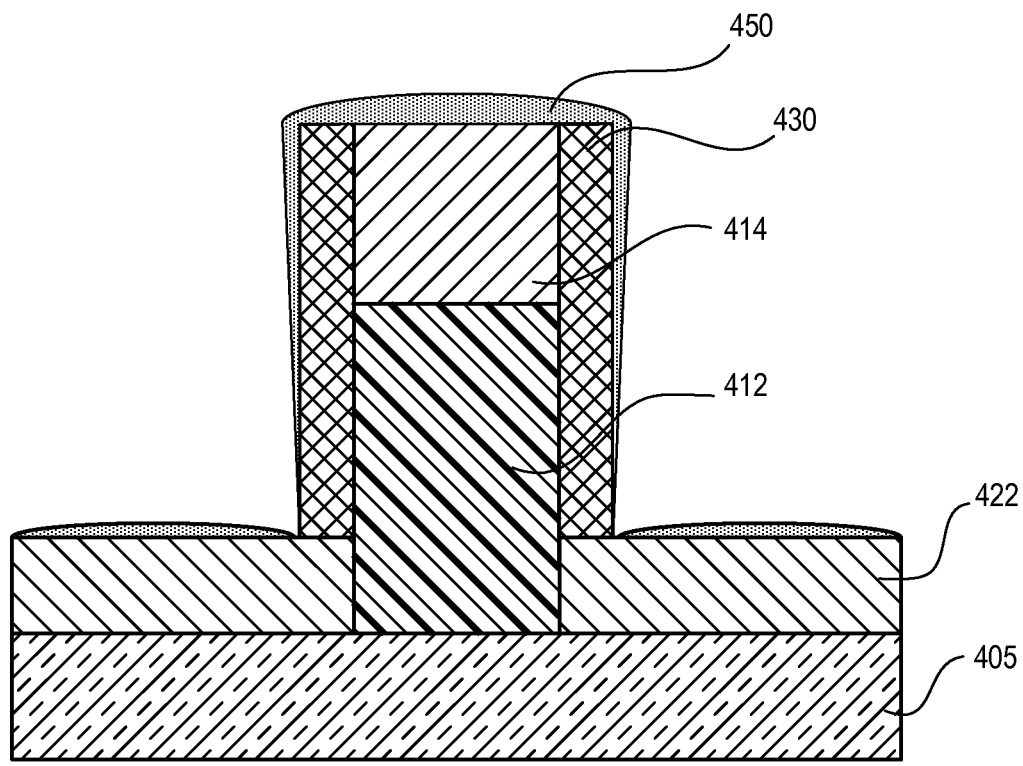
Figure 7D:
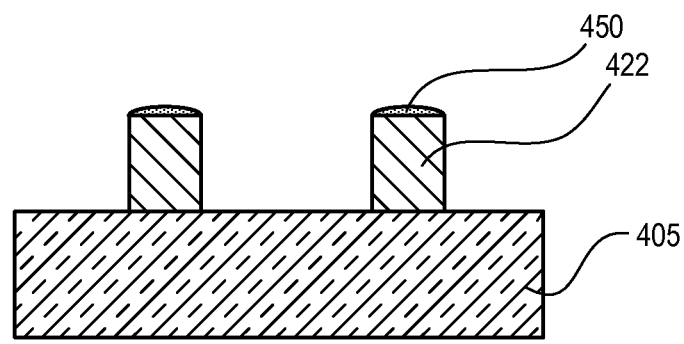

After this partial removal of the conformal layer, an aspect ratio dependent deposition process is performed, as described in FIGS. 4C and 5C, which deposits a protection layer 450 as shown in FIGS. 6D and 7D. For example, before a subsequent SiN (conformal layer) spacer etch step, a thin layer of SiOClx can be formed. For example, SiCL4+O2 can be used to generate SiOClx. Alternatively, CxHyFz plasma can be used to perform protection layer deposition on spacer material. CFx and CHx passivant/polymerizing species can assist with such protection. Thus, after depositing the conformal layer, a partial etch process can be executed prior to depositing the protection layer. If, in a particular application, preventing sidewall loss is important and there is some isotropic component to the main etch, then it can be beneficial to deposit a protective film first before any spacer etching so that some polymer is deposited on the sidewall for protection.

Figure 6E:
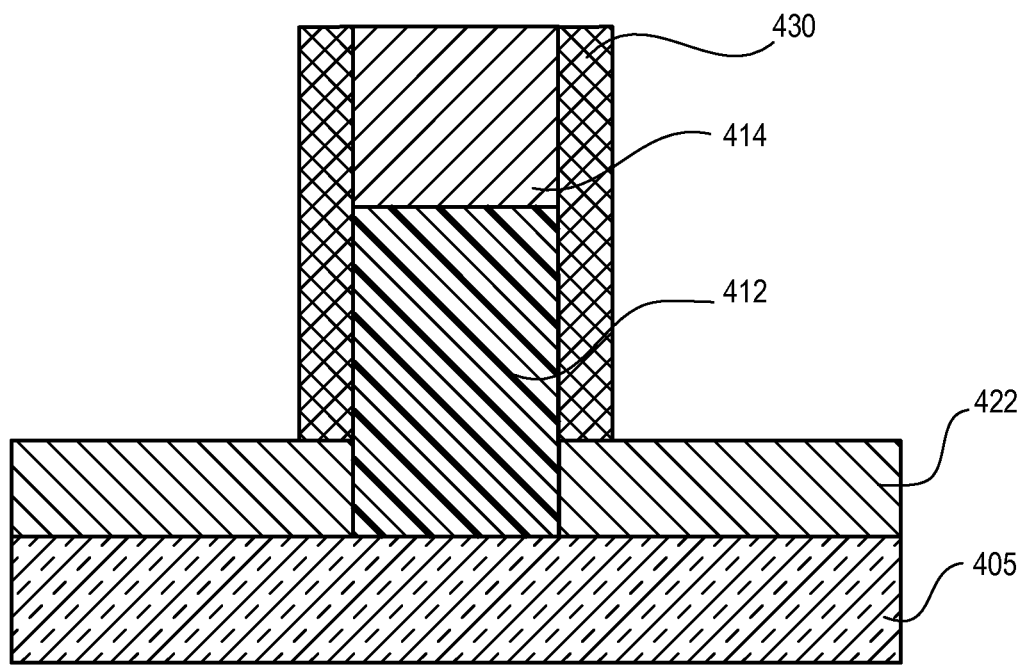
Figure 7E:
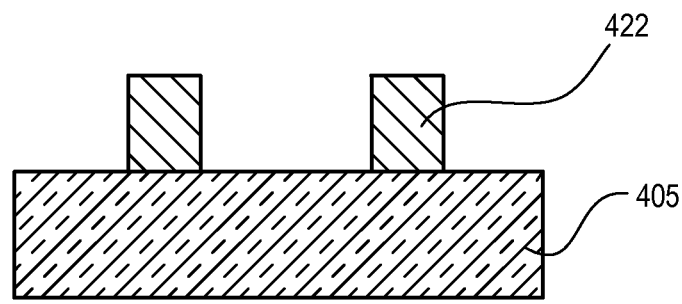

The protective layer formation may be followed by highly anisotropic removal of passivation layer/polymer layer. After protection layer 450 is deposited, an optional breakthrough etch step can be performed to remove material that covers spaces between fins/gates, or that overhangs structure edges too far. Then a main etch and/or over etch can be performed to remove spacer material from around the second structure or fins. Spacer etch chemistry may include CxHyFz chemistry with addition of Ar/O2/N2. Spacer etch chemistry may etch SiOClx or CFx/CHx layer on spacer material but at a lower rate as compared to etching SiN. The result of the spacer etch leaves a spacer surrounding the first structure as shown in FIGS. 6E and 7E. Some protection layer material may remain on top of the first and second structures. The remaining protection layer material can be removed leaving the spacer material and hard mask covering dummy gate 412.

Figure 8:
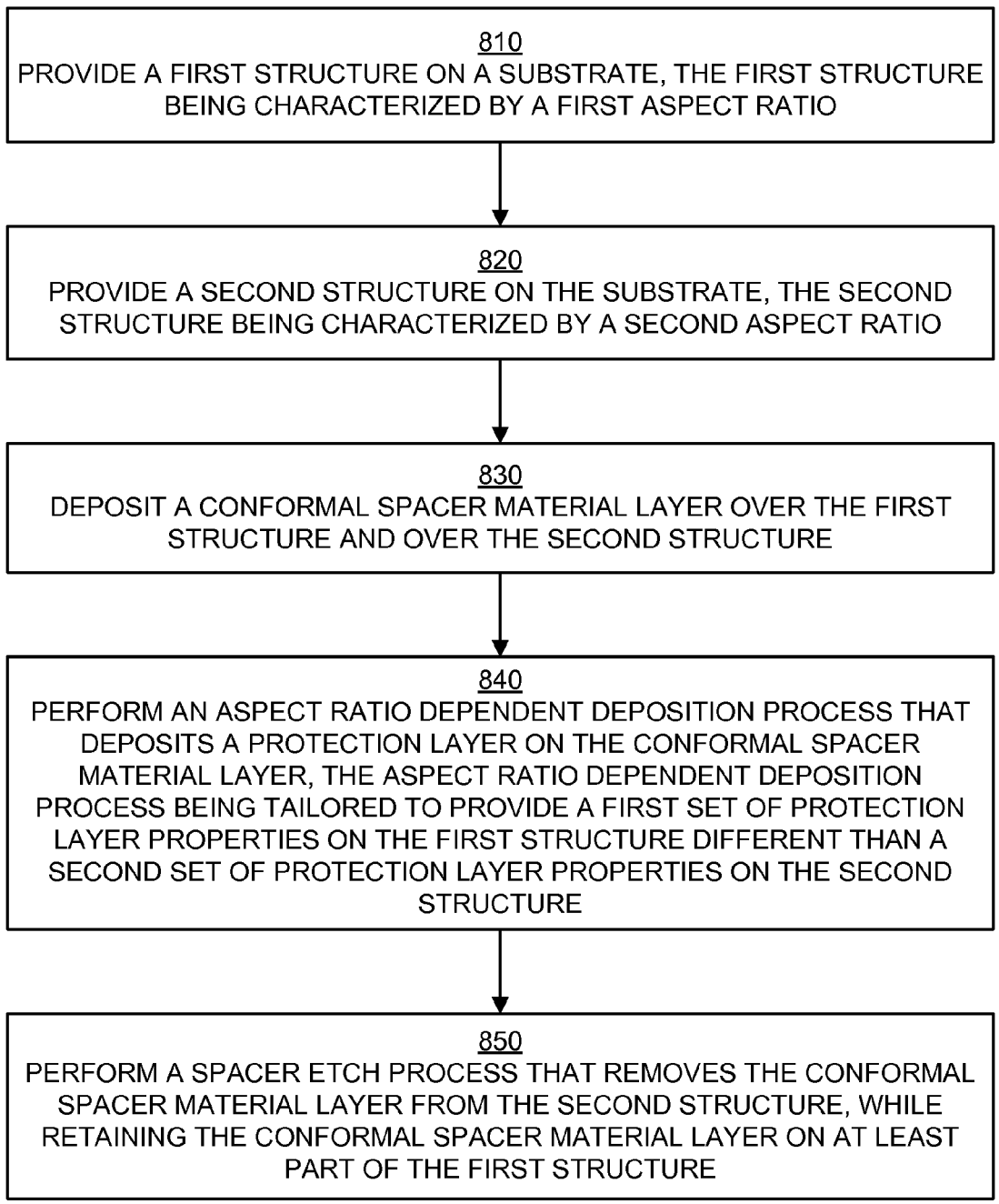
FIG. 8 is a flow chart illustration a method for performing a spacer etch process according to embodiments herein.

FIG. 8 is a flow chart of an example process flow for preparing a spacer on a substrate structure. In step 810, a first structure is provided on a substrate, the first structure is characterized by a first aspect ratio.

In step 820, a second structure is provided on the substrate, the second structure being characterized by a second aspect ratio. For example, the first structure and the second structure can be part of a 3D finFET device, such as a gate structure and a fin structure, each with respective critical dimensions.

In step 830, a conformal spacer material layer is deposited over the first structure and over the second structure. For example a layer of silicon nitride can be conformally applied over a FinFET structure.

In step 840, an aspect ratio dependent deposition process is performed that deposits a protection layer on the conformal spacer material layer. The aspect ratio dependent deposition process is tailored to provide a first set of protection layer properties on the first structure different than a second set of protection layer properties on the second structure. For example, the first set of protection layer properties on the first structure can be a thicker layer as compared to the second structure, or a more etch resistant layer as compared to the second structure.

Performing the aspect ratio dependent deposition process can include several alternative embodiments or optional process steps. For example, performing the aspect ratio dependent deposition process can include performing a vapor deposition process in an environment containing silicon (Si), chlorine (Cl), and oxygen (O), and wherein the protection layer comprises Si, O, and Cl. Performing the deposition can include performing a plasma-assisted deposition process that includes generating plasma using a film forming process composition containing, as incipient ingredients, SiCl4 and O2. This plasma-assisted deposition process can exclude application of a radio frequency (RF) bias to a substrate holder upon which the substrate rests. In other embodiments, RF bias can be added to adjust balance between aspect ratio dependent deposition and anisotropic deposition. Thus, depending on a particular requirement, a passivant thickness can be tuned.

This aspect ratio dependent deposition can be a function of physical geometry of structures and/or sticking coefficient of the radicals from the plasma. Typically gates are significantly taller than fins, with heights of 40-200 nm. Spacing between gates can be approximately 40 nm, while fins can have a tighter minimum spacing of between 30-40 nm. Note that these example dimensions can be scaled in either direction.

With higher sticking coefficients, radicals will stick to the first surface encountered. Although radical mobility is isotropic, radicals in general travel from the plasma source to features on the substrate because of process gas flow, and so horizontal surfaces can be encountered more often than vertical surfaces in some plasma processing systems. Thus, upper horizontal surfaces can receive more polymers, while lower horizontal surfaces receive comparatively less. Points on vertical surfaces that are closer to the plasma or visible to the plasma can receive more polymer as compared to points on vertical surfaces closer to the substrate or in between structures (surfaces largely shadowed from the plasma). With a lower sticking coefficient, radicals can bounce off a given surface and stick to other surfaces resulting in more of a conformal deposition. Gasses such as C4F6, C4F8, and CS3F can stick preferentially to the top of structures with little material traveling to the bottom of structures.

Deposition parameters can affect the sticking coefficient. Such parameters can include type of power (microwave, inductive, capacitive), temperature of the substrate, plasma chemistry, and pressure within the process chamber. Pressure in particular can affect the sticking coefficient. For example, in addition to bias power, a process chamber pressure can determine whether deposition is aspect ratio dependent or conformal. At lower pressures there can be aspect ratio dependent deposition, while at higher pressures there is conformal deposition. By way of a non-limiting example, high pressures can be between 50-100 milliTorr, while low pressures can be around 2-20 milliTorr. Note that during deposition the plasma can be simultaneously depositing and etching. For example, depending on a selected plasma chemistry, at higher pressures the plasma may have some extra fluorine contributing to more etching while simultaneously depositing CF2 species. Likewise, at lower pressures there can be more CF2 species created, which can contribute to more deposition than etching. Pressure can be maintained around 1-40 milliTorr for a beneficial sticking coefficient. A temperature of the substrate can be maintained in a range from about 0 degrees C. to about 100 degrees C. for some embodiments.

Forming the spacer protection layer can comprise adjusting at least one process parameter in the plasma-assisted deposition process to alter an etch resistance of the protection layer to the spacer etch process. The deposition process can include exposing the substrate to SiCl4 and H2O, and heating the substrate.

The protection layer can contain carbon and at least one element selected from the group consisting of fluorine and hydrogen. For example, performing the aspect ratio dependent deposition process can include performing a vapor deposition process in an environment containing carbon and at least one element selected from the group consisting of fluorine and hydrogen.

Performing the aspect ratio dependent deposition process can include performing a plasma-assisted deposition process that includes generating plasma using a film-forming process composition comprising, as incipient ingredients, a fluorocarbon gas expressed as CxHyFz, wherein x and z are non-zero. Alternatively, a plasma can be generated using a film forming process composition comprising, as incipient ingredients, a fluorocarbon gas expressed as CxHy, where x and y are non-zero.

The plasma-assisted deposition process can exclude application of a radio frequency (RF) bias to a substrate holder upon which the substrate rests. In other embodiments, RF bias can be applied and/or varied to tune relative thicknesses of deposited protection material. A temperature of the substrate can range from about 0 degrees C. to about 100 degrees C.

In step 850, a spacer etch process is performed that removes the conformal spacer material layer from the second structure, while retaining the conformal spacer material layer on at least part of the first structure. Performing the spacer etch process can comprise using a plasma etching process that includes generating plasma using an etching process composition comprising, as incipient ingredients, a CxHyFz-containing gas, where x and z are non-zero, and a noble gas.

Another embodiment includes a method for preparing a spacer on a substrate structure. This method includes providing a first structure on a substrate with the first structure having a first top portion extending a first height from the substrate. A second structure on the substrate is provided adjacent to the first structure with the second structure having a second top portion extending a second height from the substrate. The first height extends farther from the substrate as compared to the second height. A conformal spacer material layer is deposited over the first structure and over the second structure.

A deposition process is performed that deposits a polymer protection layer on the conformal spacer material layer. The deposition process includes creating a monomer material within a plasma formed above the substrate. The monomer flows substantially isotropically towards the substrate. The monomer material has a sticking coefficient sufficient such that a first thickness of the polymer protection layer formed on the first top portion of the first structure is thicker as compared to a second thickness of the polymer protection layer formed on the second top portion of the second structure. A spacer etch process is performed that removes the conformal spacer material layer from the second structure, while retaining the conformal spacer material layer on at least part of the first structure.

In another embodiment, a breakthrough etch process is performed prior to performing the spacer etch process. The breakthrough etch process is anisotropic and removes a portion of the polymer protection layer on the second structure. Prior to performing the deposition process, a partial spacer etch process is performed that removes the conformal spacer material from the first top portion and from the second top portion. The first structure can be a gate structure or a dummy gate structure of a transistor, while the second structure is a fin structure of a transistor.

Although the process steps herein are presented as single steps in a sequence, embodiments can include a cyclical process of deposition and etching steps. For example, if a deposited protection layer runs out after relatively short etching time, then the deposition step can be repeated. In some applications cyclical processes can provide a thinner deposition.

In one embodiment, the deposition process for forming the protection layer 450, and the one or more etching processes are performed in the same plasma processing system. In an alternate embodiment, the deposition process for forming the protection layer 450, and the one or more etching processes are performed in separate plasma processing systems.

Figure 9:
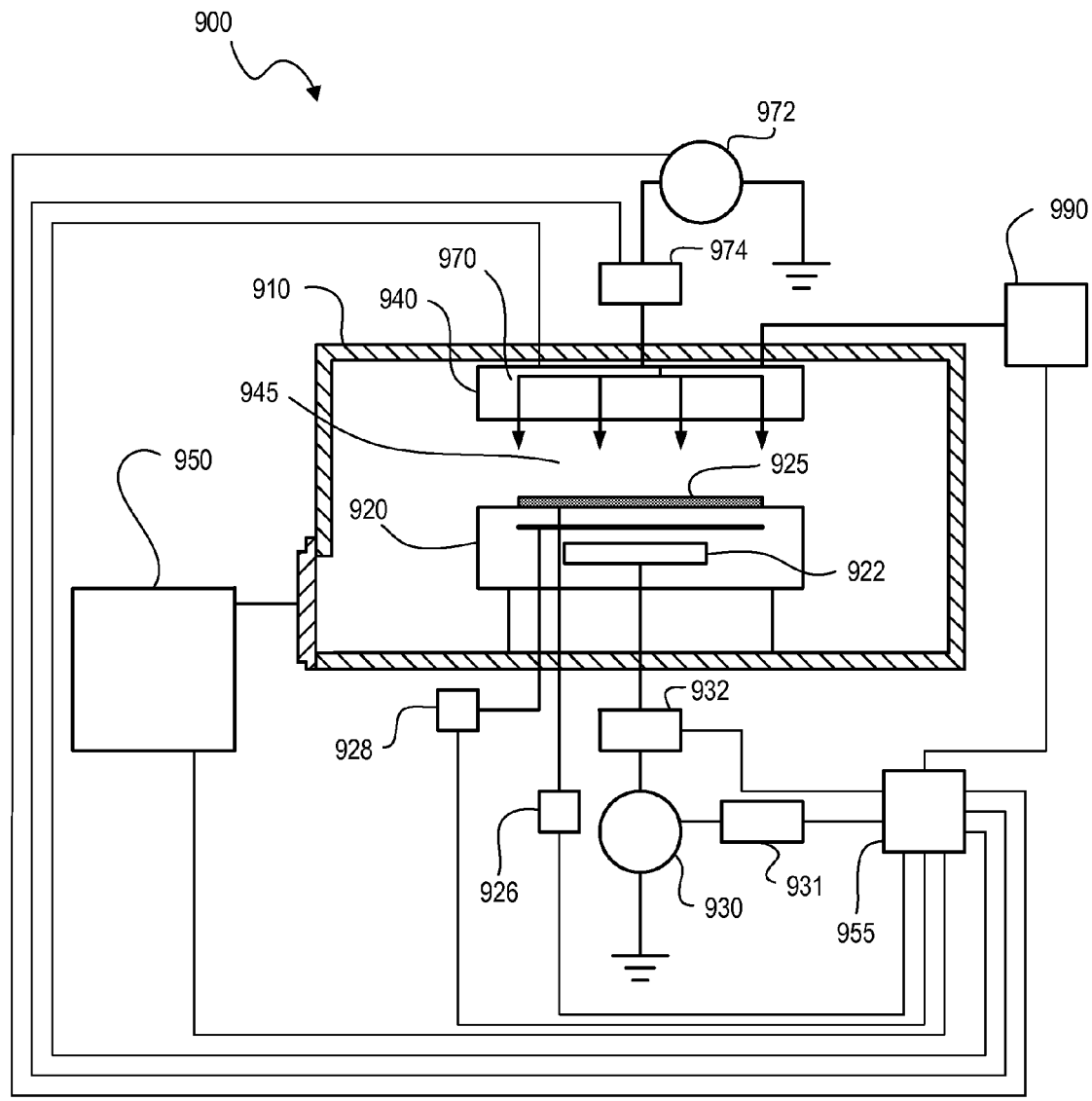
FIG. 9 shows a schematic representation of a plasma processing system according to embodiments herein.

Various different plasma processing systems can be used for process steps of deposition and etching. One or more of the methods for performing a spacer etch process sequence according to various embodiments described above may be performed in any one of various conventional plasma processing systems. FIG. 9 illustrates one example plasma processing system 900. Plasma processing system 900 is configured to perform the above identified process condition, and includes a plasma processing chamber 910, substrate holder 920, upon which a substrate 925 to be processed is affixed, and vacuum pumping system 950. Substrate 925 can be a semiconductor substrate, a wafer, a flat panel display, or a liquid crystal display. Plasma processing chamber 910 can be configured to facilitate the generation of plasma in plasma processing region 945 in the vicinity of a surface of substrate 925. An ionizable gas or mixture of process gases is introduced via a gas distribution system 940. For a given flow of process gas, the process pressure is adjusted using the vacuum pumping system 950. Plasma can be utilized to create materials specific to a pre-determined materials process, and/or to aid the removal of material from the exposed surfaces of substrate 925. The plasma processing system 900 can be configured to process substrates of any desired size, such as 200 mm substrates, 300 mm substrates, 450 mm or larger.

Substrate 925 can be affixed to the substrate holder 920 via a clamping system 928, such as a mechanical clamping system or an electrical clamping system (e.g., an electrostatic clamping system). Furthermore, substrate holder 920 can include a heating system (not shown) or a cooling system (not shown) that is configured to adjust and/or control the temperature of substrate holder 920 and substrate 925. The heating system or cooling system may comprise a re-circulating flow of heat transfer fluid that receives heat from substrate holder 920 and transfers heat to a heat exchanger system (not shown) when cooling, or transfers heat from the heat exchanger system to substrate holder 920 when heating. In other embodiments, heating/cooling elements, such as resistive heating elements, or thermo-electric heaters/coolers can be included in the substrate holder 920, as well as the chamber wall of the plasma processing chamber 910 and any other component within the plasma processing system 900.

Additionally, a heat transfer gas can be delivered to the backside of substrate 925 via a backside gas supply system 926 in order to improve the gas-gap thermal conductance between substrate 925 and substrate holder 920. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 925.

Substrate holder 920 can comprise an electrode 922 through which RF power is coupled to the processing plasma in plasma processing region 945. For example, substrate holder 920 can be electrically biased at a RF voltage via the transmission of RF power from a RF generator 930 through an optional impedance match network 932 to substrate holder 920. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are known to those skilled in the art.

Furthermore, the electrical bias of electrode 922 at a RF voltage may be pulsed using pulsed bias signal controller 931. The RF power output from the RF generator 930 may be pulsed between an off-state and an on-state, for example. Alternately, RF power is applied to the substrate holder electrode at multiple frequencies. Furthermore, impedance match network 932 can improve the transfer of RF power to plasma in plasma processing chamber 910 by reducing the reflected power. Match network topologies (e.g. L-type, π-type, T-type, etc.) and automatic control methods are known to those skilled in the art.

Gas distribution system 940 may comprise a showerhead design for introducing a mixture of process gases. Alternatively, gas distribution system 940 may comprise a multi-zone showerhead design for introducing a mixture of process gases and adjusting the distribution of the mixture of process gases above substrate 925. For example, the multi-zone showerhead design may be configured to adjust the process gas flow or composition to a substantially peripheral region above substrate 925 relative to the amount of process gas flow or composition to a substantially central region above substrate 925.

Vacuum pumping system 950 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 910.

Controller 955 comprises a microprocessor, memory, and a digital I/O port capable of generating control voltages sufficient to communicate and activate inputs to plasma processing system 900 as well as monitor outputs from plasma processing system 900. Moreover, controller 955 can be coupled to and can exchange information with RF generator 930, pulsed bias signal controller 931, impedance match network 932, the gas distribution system 940, vacuum pumping system 950, as well as the substrate heating/cooling system (not shown), the backside gas supply system 926, and/or the electrostatic clamping system 928. For example, a program stored in the memory can be utilized to activate the inputs to the aforementioned components of plasma processing system 900 according to a process recipe in order to perform a plasma assisted process, such as a plasma etch process, on substrate 925.

Controller 955 can be locally located relative to the plasma processing system 900, or it can be remotely located relative to the plasma processing system 900. For example, controller 955 can exchange data with plasma processing system 900 using a direct connection, an intranet, and/or the internet. Controller 955 can be coupled to an intranet at, for example, a customer site (i.e., a device maker, etc.), or it can be coupled to an intranet at, for example, a vendor site (i.e., an equipment manufacturer). Alternatively or additionally, controller 955 can be coupled to the internet. Furthermore, another computer (i.e., controller, server, etc.) can access controller 955 to exchange data via a direct connection, an intranet, and/or the internet.

Plasma processing system 900 can further comprise either a stationary, or mechanically or electrically rotating magnetic field system (not shown) to potentially increase plasma density and/or improve plasma processing uniformity. Moreover, controller 955 can be coupled to a magnetic field system to regulate the speed of rotation and field strength. The design and implementation of a rotating magnetic field is well known to those skilled in the art.

Plasma processing system 900 can further comprise an upper electrode 970 to which RF power can be coupled from RF generator 972 through optional impedance match network 974. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 955 is coupled to RF generator 972 and impedance match network 974 in order to control the application of RF power to upper electrode 970. The design and implementation of an upper electrode is known to those skilled in the art. The upper electrode 970 and the gas distribution system 940 can be designed within the same chamber assembly, as shown. Alternatively, upper electrode 970 may comprise a multi-zone electrode design for adjusting the RF power distribution coupled to plasma above substrate 925. For example, the upper electrode 970 may be segmented into a center electrode and an edge electrode.

Plasma processing system 900 can further comprise a direct current (DC) power supply 990 coupled to the upper electrode 970 opposing substrate 925. The upper electrode 970 may comprise an electrode plate. The electrode plate may comprise a silicon-containing electrode plate. Moreover, the electrode plate may comprise a doped silicon electrode plate. The DC power supply 990 can include a variable DC power supply. Additionally, the DC power supply 990 can include a bipolar DC power supply. The DC power supply 990 can further include a system configured to perform at least one of monitoring, adjusting, or controlling the polarity, current, voltage, or on/off state of the DC power supply 990. Once plasma is formed, the DC power supply 990 facilitates the formation of a ballistic electron beam. An electrical filter (not shown) may be utilized to de-couple RF power from the DC power supply 990.

For example, the DC voltage applied to upper electrode 970 by DC power supply 990 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 970. The surface of the upper electrode 970 facing the substrate holder 920 may be comprised of a silicon-containing material.

Other types of known plasma processing systems can also be used to execute techniques disclosed herein. For example, alternate plasma processing systems (not shown) further comprise an inductive coil to which RF power is coupled via an RF generator through an optional impedance match network. RF power is inductively coupled from the inductive coil through a dielectric window to the plasma processing region. A frequency for the application of RF power to the inductive coil can range from about 10 MHz to about 100 MHz. Similarly, a frequency for the application of power to the chuck electrode can range from about 0.1 MHz to about 100 MHz. In addition, a slotted Faraday shield can be employed to reduce capacitive coupling between the inductive coil and plasma in the plasma processing region. Moreover, a controller can be coupled to the RF generator and the impedance match network to control the application of power to the inductive coil.

In an alternate embodiment, a plasma processing system can comprise an inductive coil that is a "spiral" coil or "pancake" coil in communication with the plasma processing region from above as in a transformer-coupled plasma (TCP) reactor. The design and implementation of an inductively coupled plasma (ICP) source, or transformercoupled plasma (TCP) source, is well known to those skilled in the art. Alternately, plasma can be formed using electron cyclotron resonance (ECR). In yet another embodiment, the plasma is formed from the launching of a Helicon wave. In yet another embodiment, the plasma is formed from a propagating surface wave. Other plasma processing systems can be similar to the embodiment of FIG. 9, and can further comprise a surface wave plasma (SWP) source. The SWP source can comprise a slot antenna, such as a radial line slot antenna (RLSA), to which microwave power is coupled via a power coupling system. Each plasma source described above is well known to those skilled in the art.

Details included in this disclosure have been set forth for the purpose of explanation and not limitation. Embodiments disclosed herein have been described with reference to the accompanying drawings. For purposes of explanation, specific numbers, materials, and configurations have been set forth to provide a thorough understanding of the various embodiments. Nevertheless, the techniques herein may be practiced without specific details. Furthermore, it is understood that the various embodiments shown in the figures are illustrative representations and are not necessarily drawn to scale. Components having substantially the same functional constructions have been denoted with like reference characters, and thus any redundant descriptions may have been omitted.

Various techniques may have been described as multiple discrete operations to assist in understanding the various embodiments. The order of description should not be construed as to imply that these operations are necessarily order dependent. Indeed, these operations need not be performed in the order of presentation. Described operations may be performed in a different orders than as presented in example embodiments. Various additional operations may be performed and/or described operations may be omitted in additional embodiments.

"Substrate" or "target substrate" as used herein generically refers to the object being processed in accordance with techniques herein. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, can include any such layer or base structure, and any combination of layers and/or base structures. The description may reference particular types of substrates, but this is for illustrative purposes only.

Although several embodiments of this disclosure have been described in detail above, those skilled in the art will readily appreciate that many modifications are possible in the embodiments without materially departing from the novel teachings and advantages of described techniques. Accordingly, all such modifications are included within the scope of this disclosure.

The invention claimed is:

1. A method for preparing a spacer on a substrate structure, the method comprising:
providing a first structure on a substrate, the first structure being characterized by a first aspect ratio;
providing a second structure on the substrate, the second structure being characterized by a second aspect ratio, the first aspect ratio being greater than the second aspect ratio;
depositing a conformal spacer material layer over the first structure and over the second structure;
performing an aspect ratio dependent deposition process that deposits a protection layer on the conformal spacer material layer via substantially isotropic vapor deposition of the protection layer, the aspect ratio dependent deposition process resulting in a first thickness of the polymer protection layer formed on a top portion of the first structure and a second thickness of the polymer protection layer formed on a top portion of the second structure, the first thickness of the polymer protection layer being greater as compared to the second thickness of the polymer protection layer; and
performing a spacer etch process that removes the conformal spacer material layer from the second structure, while retaining the conformal spacer material layer on at least part of the first structure.

2. The method of claim 1, wherein the first structure includes a gate structure characterized by a gate critical dimension and the second structure includes a fin structure arranged orthogonal to the gate structure, the gate structure conformally applied over the fin structure.

3. The method of claim 2, wherein the fin structure includes a plurality of fins, each fin being characterized by a fin critical dimension.

4. The method of claim 1, wherein the conformal spacer material layer is composed of silicon nitride (SiN), silicon carbide (SiC), silicon carbonitride (SiCN), silicon oxycarbonnitride (SiOCN), Boron-doped silicon nitride, Carbon-doped silicon nitride, Oxygen-doped silicon nitride, or Carbon and Boron-doped silicon nitride; and
wherein the conformal spacer material layer has a thickness less than or equal to about 10 nanometers (nm).

5. The method of claim 1, wherein performing the aspect ratio dependent deposition process comprises performing a vapor deposition process in an environment containing Si, Cl, and O, and wherein the protection layer comprises Si, O, and Cl.

6. The method of claim 1, wherein performing the aspect ratio dependent deposition process comprises performing a plasma-assisted deposition process that includes generating plasma using a film forming process composition containing as incipient ingredients SiCl4 and O2.

7. The method of claim 6, wherein the plasma-assisted deposition process excludes application of a radio frequency (RF) bias to a substrate holder upon which the substrate rests, and wherein a temperature of the substrate ranges from about 0 degrees C. to about 100 degrees C.

8. The method of claim 7, wherein the forming the protection layer comprises adjusting at least one process parameter in the plasma-assisted deposition process to alter an etch resistance of the protection layer to the spacer etch process.

9. The method of claim 1, wherein performing the aspect ratio dependent deposition process comprises exposing the substrate to SiCl4 and H2O, and heating the substrate.

10. The method of claim 1, wherein the protection layer contains carbon and at least one element selected from the group consisting of fluorine and hydrogen.

11. The method of claim 10, wherein performing the aspect ratio dependent deposition process comprises performing a vapor deposition process in an environment containing carbon and at least one element selected from the group consisting of fluorine and hydrogen.

12. The method of claim 10, wherein performing the aspect ratio dependent deposition process comprises performing a plasma-assisted deposition process that includes generating plasma using a film-forming process composition comprising, as incipient ingredients, a fluorocarbon gas expressed as CxHyFz, wherein x and z are non-zero.

13. The method of claim 10, wherein performing the aspect ratio dependent deposition process comprises performing a plasma-assisted deposition process that includes generating plasma using a film forming process composition comprising, as incipient ingredients, a fluorocarbon gas expressed as CxHy, where x and y are non-zero.

14. The method of claim 12, wherein the plasma-assisted deposition process excludes application of a radio frequency (RF) bias to a substrate holder upon which the substrate rests.

15. The method of claim 12, wherein a temperature of the substrate ranges from about 0 degrees C. to about 100 degrees C.

16. The method of claim 1, wherein performing the spacer etch process comprises using a plasma etching process that includes generating plasma using an etching process composition comprising, as incipient ingredients, a CxHyFz-containing gas, where x and z are non-zero, and a noble gas.

17. The method of claim 1, wherein the first structure and the second structure are part of a 3D finFET device.

18. A method for preparing a spacer on a substrate structure, the method comprising:
providing a first structure on a substrate, the first structure having a first top portion extending a first height from the substrate;
providing a second structure on the substrate adjacent to the first structure, the second structure having a second top portion extending a second height from the substrate, the first height extending farther from the substrate as compared to the second height;
depositing a conformal spacer material layer over the first structure and over the second structure;
performing a deposition process that deposits a polymer protection layer on the conformal spacer material layer, the deposition process including creating a monomer within a plasma formed above the substrate, the monomer flowing substantially isotropically towards the substrate, the monomer having a sticking coefficient sufficient such that a first thickness of the polymer protection layer formed on the first top portion of the first structure is thicker as compared to a second thickness of the polymer protection layer formed on the second top portion of the second structure; and
performing a spacer etch process that removes the conformal spacer material layer from the second structure, while retaining the conformal spacer material layer on at least part of the first structure.

19. The method of claim 18, further comprising:
performing a breakthrough etch process prior to performing the spacer etch process, the breakthrough etch process being anisotropic and removing a portion of the polymer protection layer on the second structure.

20. The method of claim 19, further comprising:
prior to performing the deposition process, performing a partial spacer etch process that removes conformal spacer material from the first top portion and from the second top portion;
wherein the first structure is a gate structure or a dummy gate structure of a transistor, and wherein the second structure is a fin structure of a transistor.

\* \* \* \* \*